United States Patent
Tsai et al.

(10) Patent No.: US 9,396,986 B2
(45) Date of Patent: *Jul. 19, 2016

(54) MECHANISM OF FORMING A TRENCH STRUCTURE

(71) Applicant: Taiwan Semiconductor Manufacturing Company, Ltd., Hsin-Chu (TW)

(72) Inventors: Chun Hsiung Tsai, Xinpu Township (TW); Sen-Hong Syue, Zhubei (TW); Ziwei Fang, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 26 days.

This patent is subject to a terminal disclaimer.

(21) Appl. No.: 14/046,384

(22) Filed: Oct. 4, 2013

(65) Prior Publication Data

US 2015/0099342 A1    Apr. 9, 2015

(51) Int. Cl.
| | | |
|---|---|---|
| *H01L 21/762* | (2006.01) | |
| *H01L 21/76* | (2006.01) | |
| *H01L 21/02* | (2006.01) | |
| *H01L 27/108* | (2006.01) | |
| *H01L 21/8238* | (2006.01) | |
| *H01L 29/78* | (2006.01) | |

(52) U.S. Cl.
CPC .... *H01L 21/76237* (2013.01); *H01L 21/02164* (2013.01); *H01L 21/76* (2013.01); *H01L 21/76205* (2013.01); *H01L 21/76224* (2013.01); *H01L 21/76229* (2013.01); *H01L 21/823878* (2013.01); *H01L 27/1087* (2013.01); *H01L 29/7846* (2013.01)

(58) Field of Classification Search
CPC ............... H01L 21/76224; H01L 21/76229; H01L 21/823878; H01L 29/7846; H01L 21/76205; H01L 27/1087; H01L 21/02164; H01L 21/76

See application file for complete search history.

(56) References Cited

U.S. PATENT DOCUMENTS

| | | | |
|---|---|---|---|
| 6,440,808 B1 * | 8/2002 | Boyd et al. | 438/305 |
| 7,902,037 B2 * | 3/2011 | Eun | 438/435 |
| 7,919,390 B2 * | 4/2011 | Eun | 438/435 |
| 8,823,075 B2 * | 9/2014 | Purayath et al. | 257/321 |
| 8,846,536 B2 * | 9/2014 | Draeger et al. | 438/694 |
| 9,184,089 B2 * | 11/2015 | Tsai | H01L 21/76224 |
| 2006/0110892 A1 * | 5/2006 | Orlowski et al. | 438/435 |
| 2007/0298585 A1 | 12/2007 | Lubomirsky et al. | |
| 2014/0151760 A1 * | 6/2014 | Wang et al. | 257/288 |
| 2015/0104923 A1 * | 4/2015 | Tsai et al. | 438/424 |

* cited by examiner

*Primary Examiner* — Bac Au

(74) *Attorney, Agent, or Firm* — Slater Matsil, LLP

(57) ABSTRACT

Forming a shallow trench isolation (STI) structure filled with a flowable dielectric layer involves performing an implant to generate passages in the upper portion of the flowable dielectric layer. The passages enable oxygen source in a thermal anneal to reach the flowable dielectric layer near the bottom of the STI structure during the thermal anneal to convert a SIONH network of the reflowable dielectric layer to a network of SiOH and SiO. The passages also help to provide escape paths for by-products produced during another thermal anneal to convert the network of SiOH and SiO to $SiO_2$.

20 Claims, 4 Drawing Sheets

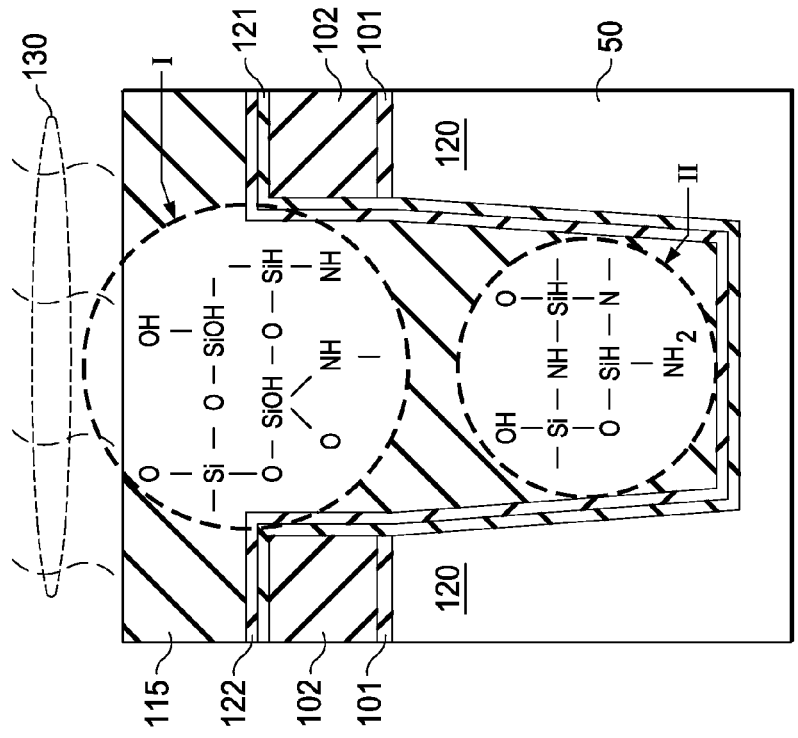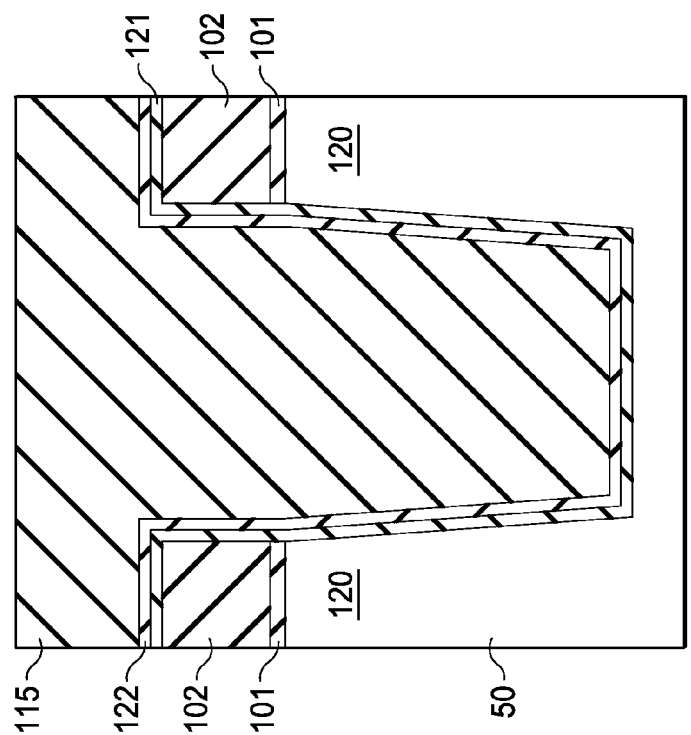

MECHANISM OF FORMING A TRENCH STRUCTURE

BACKGROUND

Trench structures, such as shallow trench isolations (STIs), are used to separate and isolate active areas on a semiconductor wafer from each other. STIs are formed by etching trenches in a substrate, overfilling the trenches with a dielectric such as an oxide, and then removing any excess dielectric. STIs help to electrically isolate the active areas from one another.

However, as circuit densities continue to increase, the widths of trenches of STIs decrease, thereby increasing the aspect ratios of the STI trenches. Aspect ratio of a trench (or a gap) is defined as the trench height (or gap height) divided by the trench width (or gap width). It becomes very difficult to fill narrow and deep trenches completely with a gap-fill dielectric material for advanced technologies. Incomplete gap-filling results in unwanted voids and increases the risk of inclusion of unwanted defects when the unwanted voids are exposed during removal of excess dielectric. The voids may also result in inadequate isolation between active areas. The presence of voids in STI would affect yield.

BRIEF DESCRIPTION OF THE DRAWINGS

The disclosure will be described with reference to embodiments thereof as illustrated in the accompanying figures. It should be understood that the drawings are for illustrative purposes and are therefore not drawn to scale.

FIGS. 1 to 8 are cross-sectional views of a sequential process for forming a shallow trench isolation (STI) structure at various fabrication stages, in accordance with some embodiments.

DETAILED DESCRIPTION

Figure 1:
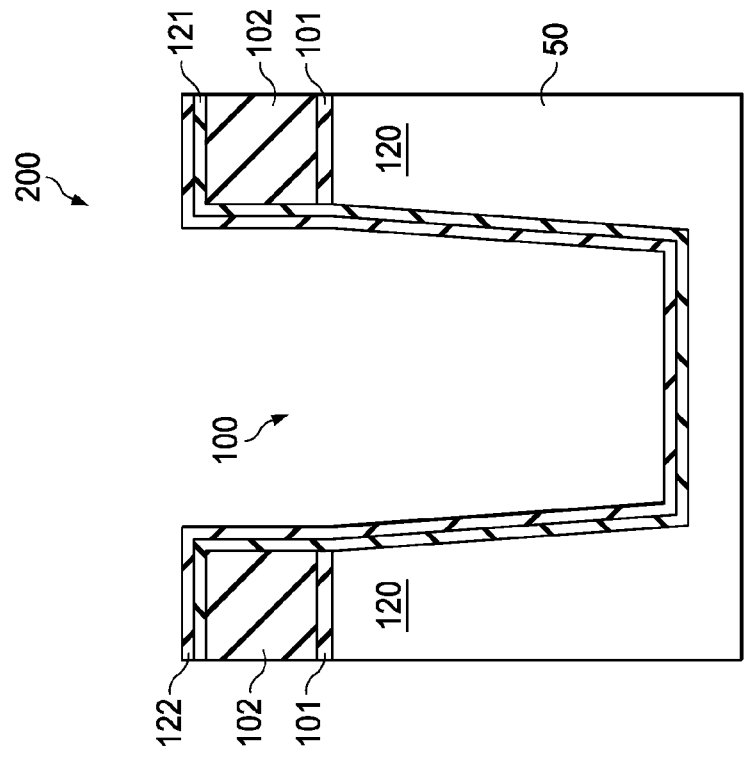

It is to be understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

As transistor sizes decrease, the sizes of various features associated with forming transistors also decrease. One such feature is the shallow trench isolation (STI) formed between active regions to provide isolation. As discussed, the feature size reduction results in increased aspect ratios because the openings are smaller but not the depth of the STI. Techniques used to fill STIs having lower aspect ratios cannot be used to adequately fill STIs of advanced technologies having high aspect ratios. In many chemical vapor deposition (CVD) processes, plasma is used with silicon-containing precursors and oxygen-containing gas to form silicon oxide directly on the surface of the substrate. These plasma-based CVD processes form silicon oxide as deposited; however, they fill poorly for structures with high aspect ratios.

One alternative to improve filling pertains to using flowable dielectric materials instead of conventional silicon oxide as deposited. Flowable dielectric materials, as their name suggest, can "flow" during deposition to fill voids in a gap. Usually, various chemistries are added to the silicon-containing precursors to allow the deposited film to flow. In some embodiments, nitrogen hydride bonds are added. Examples of flowable dielectric precursors, particularly flowable silicon oxide precursors, include a silicate, a siloxane, a methyl SilsesQuioxane (MSQ), a hydrogen SisesQuioxane (HSQ), an MSQ/HSQ, a perhydrosilazane (TCPS), a perhydro-polysilazane (PSZ), a tetraethyl orthosilicate (TEOS), or a silylamine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The curing and annealing may result in oxidation of the trench walls and widen the isolation regions. Further, the flowable film is cured and annealed more than once at high temperatures, such as in a range from about 1000° C. to about 1200° C., and for an extended period, such as 30 hours or more in total. The cure and anneals significantly reduce the thermal budget allowed for the rest of the semiconductor manufacturing process. Further, the high anneal temperatures with extended annealing cycles might not be acceptable for devices of advanced technologies. Therefore, there is a need to develop a different mechanism for forming STI structures.

FIGS. 1 to 8 are cross-sectional views of various stages of forming a STI structure 200 in a substrate 50, in accordance with some embodiments. FIG. 1 shows a trench 100, which is formed in substrate 50. The trench formation includes multiple operations of patterning the substrate and etching the substrate. The substrate 50 may be bulk silicon, doped or undoped, or an active layer of a silicon on insulator (SOI) substrate. Generally, an SOI substrate includes an active layer of a semiconductor material such as silicon, germanium, silicon germanium, silicon germanium on insulator (SGOI), or combinations thereof. Other substrates that may be used include multi-layered substrates, gradient substrates, or hybrid orientation substrates.

FIG. 1 also shows a patterned hard mask layer 102 and a protective layer 101 underneath formed over the top surface 110 of the substrate 50, in some embodiments. The protective layer 101 protects the surface 110 from direct contact with the hard mask layer 102. For example, if portion of the substrate 50 next to trench 100, is made of silicon, the protective layer 101 protects active regions 120. The active regions 120 are used for forming devices (such as transistors, resistors, etc.) after the STI structure (200) are formed. Depending upon the devices to be formed, the active regions 120 may comprise either an n-well or a p-well as determined by the design requirements.

The protective layer 101 is made of a thermal oxide, in some embodiments. The thickness of proactive layer 101 is in a range from about 20 nm to about 100 nm. The hard mask layer 102 assists maintaining the integrity of the patterns during etching of trench 100. In some embodiments, the hard mask layer 102 is used as a planarization stop layer during the removal of excess flowable dielectric film that fills trench 100. In some embodiments, the hard mask layer 102 is made of SiN. However, other materials, such as SiON, silicon carbide, or a combination thereof, may also be used. The thickness of hard mask layer 102 is in a range from about 200 nm to about 1200 nm. The hard masking layer 102 may be formed by a process such as chemical vapor deposition (CVD), plasma enhanced chemical vapor deposition (PECVD), or low pressure chemical vapor deposition (LPCVD). Alternatively, the hard mask layer 102 made be first made of a silicon oxide and then converted to SiN by nitridation. Once formed, the hard mask layer 102 and the proactive layer 101 are patterned through suitable photolithographic and etching processes to form the openings over surface 110 for trench 100.

The exposed portions of the substrate 50 through the openings are removed by an etching process, such as reactive ion etching (RIE), in order to form the trench 100 in substrate 50. Trench 100 separates active regions 120 near the top surface 110 of the substrate 50. Trench 100 has sidewalls 112 and a bottom surface 114. In some embodiments, the trench 100 has a width W1 in a range from about 20 nm to about 100 nm. In some embodiments, the trench 100 has a depth D1 in a range from about 50 nm to about 350 nm.

An aspect ratio, the trench depth D1 (sometimes referred to herein as trench height) divided by the trench width W1, of trench 100 is greater than about 8 or greater than 10 in some embodiments.

Figure 2:
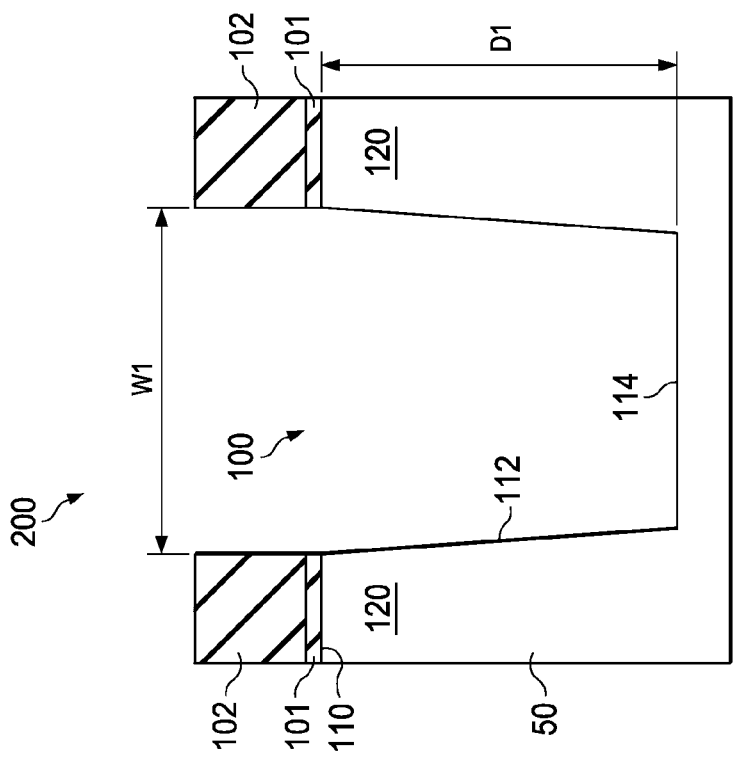

Referring to FIG. 2, a silicon oxide liner 121 and a silicon liner 122 are deposited sequentially to line trench 100, in accordance with some embodiments. The silicon oxide liner 121 and the silicon liner 122 are deposited on sidewalls 112 and bottom surface 114. In some embodiments, the silicon oxide liner 121 is thermally grown on the silicon walls of the trench 100. The substrate is exposed to an oxygen-containing environment at a high temperature and the surface exposed to the oxygen is converted to silicon oxide. In some embodiments, the oxygen-containing environment includes steam. The silicon oxide liner 121 may include an additional layer or layers over the thermally grown silicon oxide layer. In some embodiments, an additional silicon oxide layer may be deposited using plasma enhanced atomic layer deposition (PEALD). According to various embodiments, the silicon oxide liner 121 is formed to protect the silicon substrate 50 underlying the silicon oxide liner 121 from subsequent oxidation. A dense silicon oxide film such as a thermal oxide film is used to shield the underlying silicon substrate 50 from oxidation chemistry in subsequent processing. The silicon oxide liner 121 is relatively thin, in the order of tens to a hundred angstroms (Å), in order to minimize an increase in the aspect of the already high aspect-ratio trench to be filled. In some embodiments, the thickness of the silicon oxide liner 121 is in a range from about 2 nm to about 50 nm.

Referring to FIG. 2, a silicon liner layer 122 is deposited over the silicon oxide liner 121. The silicon liner layer 122 provides stress relief during thermal anneal(s) of the flowable dielectric film (to be described below). In some embodiments, the silicon liner layer 122 is amorphous silicon or polysilicon. A thickness of the silicon liner layer 122 is in a range from about 10 Å to about 40 Å. The silicon liner layer 122 may be formed by using a furnace system in a gaseous environment containing $Si_2H_6$, $SiH_4$, $Si_3H_8$, $SiCl_2H_2$, $SiCl_3H$, or a combination thereof. In some embodiments, the flow rate of $Si_2H_6$ is in the range of about 10 standard cubic centimeters per minute (sccm) to about 1000 sccm. A temperature for the formation of the silicon liner layer 122 is in a rage of about 200° C. to about 600° C., in some embodiments. A pressure range for the formation of the silicon liner layer 122 is from about 10 mTorr to about 10 Torr, in some embodiments. Alternatively, the silicon liner layer 122 may be formed by using a deposition technique that can form a conformal silicon layer, such as the low temperature chemical vapor deposition process (CVD) in a gaseous environment containing $Si_3H_8$, $SiH_4$, $SiCl_2H_2$, $SiCl_3H$, or a combination thereof.

In some embodiments, the gas environment also comprises a carrier gas such as $H_2$. The carrier gas helps to better control treatment uniformity. In some embodiments, the flow rates of $Si_3H_8$ and $H_2$ are in the range from about 10 standard cubic centimeters per minute (sccm) to about 1000 sccm, and from about 5 standard liters per minute (slm) to about 50 slm, respectively. A temperature for the formation of the silicon liner layer 112 in the chemical deposition process is in a range of about 250° C. to 550° C., in some embodiments.

After the deposition of the silicon liner layer 112 and referring to FIG. 3, a flowable dielectric material overfills the trench 100 and the hard mask layer 102 to form a flowable dielectric layer 115. The flowable dielectric layer 115 is formed by using a spin on dielectric (SOD) formation process, or by depositing a flowable dielectric by a chemical vapor deposition (CVD) process, such as radical-component CVD. The examples of flowable silicon oxide precursors, include a silicate, a siloxane, a methyl SilsesQuioxane (MSQ), a hydrogen SisesQuioxane (HSQ), an MSQ/HSQ, a perhydrosilazane (TCPS), a perhydro-polysilazane (PSZ), a tetraethyl orthosilicate (TEOS), or a silyl-amine (SA).

In some embodiments, the flowable dielectric layer 115 is deposited by using a silicon-containing precursor to react with another precursor, such as a "radical-nitrogen" precursor generated by a plasma. In some embodiments, the silicon-containing precursor is carbon-free and includes silyl-amines, such as $H_2N(SiH_3)$, $HN(SiH_3)_2$, $N(SiH_3)_3$, or a combination thereof. The silyl-amines may be mixed with additional gases that may act as carrier gases, reactive gases, or both. Examples of the additional gases may include $H_2$, $N_2$, $NH_3$, He, and Ar, among other gases. Silyl-amines may also be mixed with other carbon-free silicon-containing gas(es), such as silane ($SiH_4$) and disilane ($Si_2H_6$), hydrogen (e.g. $H_2$), and/or nitrogen (e.g. $N_2$, $NH_3$).

Nitrogen may be included in either or both of the radical precursor and the silicon-containing precursor. When nitrogen is present in the radical precursor, it may be referred to as a radical-nitrogen precursor. The radical-nitrogen precursor includes plasma effluents created by exciting a more stable nitrogen-containing precursor in plasma. For example, a relatively stable nitrogen-containing precursor containing $NH_3$ and/or hydrazine ($N_2H_4$) may be activated in a chamber plasma region or a remote plasma system (RPS) outside the processing chamber to form the radical-nitrogen precursor, which is then transported into a plasma-free substrate processing region. The stable nitrogen precursor may also be a mixture comprising a combination of $NH_3$, $N_2$, and $H_2$.

The radical-nitrogen precursor may also be accompanied by a carrier gas such as argon, helium, etc. Oxygen may be simultaneously delivered into the remote plasma region (in the form of $O_2$ and/or $O_3$) to adjust the amount of oxygen content in the radical-nitrogen precursor for forming the flowable dielectric layer 115 deposited with this technique.

The deposition of flowable dielectric layer 115 may proceed while the substrate temperature is maintained at a relatively low temperature. In some embodiments, the flowable dielectric layer 115 is deposited on the substrate surface at low temperature which is maintained by cooling the substrate during the deposition. In some embodiments, the deposition is performed at a temperature in a range from about −40° C. to about 200° C. In some embodiments, the deposition is performed at a temperature less than about 100° C.

In some embodiments, the deposition pressure is in a range from about 100 mTorr to about 10 Torr. In some embodiments, reaction source uses a gaseous environment containing trisilylamine ($Si_3H_9N$, or TSA) and $NH_3$. In one embodiment, the flow rates of $Si_3H_9N$ and $NH_3$ are in the range of about 100 sccm to about 1000 sccm, and of about 100 sccm to about 2000 sccm, respectively. This particular dielectric film could be formed by an Alectrona® system, which is offered by Applied Materials of Santa Clara, Calif. Exemplary details of depositing flowable dielectric layer 115 by the radical-component CVD process mentioned above are described in U.S. Pat. No. 8,318,584.

The as-deposited flowable dielectric layer 115 is capable of filling the narrow and deep gaps and prevents voids and discontinuities in the STI structure 100. The as-deposited flowable dielectric layer 115 comprises a flowable network of $SiO_AN_BH_C$ (or SIONH). In some embodiments, A is a number in a range from about 0.8 to about 2, B is a number from about 0.01 to about 1, and C is a number from about 0.01 to about 1. In some embodiments, the thickness of flowable dielectric layer 115 above hard mask layer 122 is in a range from about 1000 Å to about 3000 Å.

After the flowable dielectric layer 115 is deposited, an in-situ curing process 130 is performed on the as-deposited flowable dielectric layer 115, as shown in FIG. 4 in accordance with some embodiments. In-situ means the curing process 130 is performed in the process chamber for depositing the flowable dielectric layer 115. In some embodiments, the curing process 130 is performed in a different chamber (or ex-situ).

In some embodiments, the curing process 130 is operated using $O_3$ (ozone) with a flow rate in the range of about 100 sccm to about 5000 sccm, or using steam with a flow rate in a range from about 100 sccm to about 5000 sccm. A temperature for the curing process 130 is in a rage of about 10° C. to about 500° C., in some embodiments. Alternatively, steam is used during the curing process, instead of $O_3$. A pressure range for the curing process 130 is from about 1 Torr to about 760 Torr, in some embodiments. The duration of the curing process 130 is in a range from about 10 seconds to about 2 hrs, in accordance with some embodiments. The curing process 130 increases the oxygen content of the as-deposited flowable dielectric layer 115, which is made of a network of $SiO_AN_B H_C$ (or SiONH), especially the portion of as deposited flowable dielectric layer 115 near the surface.

As mentioned above, the curing process 130 increases the oxygen content of the as-deposited flowable dielectric layer 115. The flowable dielectric layer 115 near the surface is exposed to the $O_3$ more than the bottom portion of trench 100. FIG. 4 shows an exemplary SiONH network (I) near the surface and another exemplary SiONH network (II) near the bottom of trench (100). The SiONH network near the surface contains more oxygen (or O) than the SiONH network near the bottom. The cured flowable dielectric layer 115 includes nitrogen hydride bonds and is less dense than a silicon oxide film.

In order to convert the SiONH network into a SiO (or $SiO_2$) network, additional thermal anneal is needed. The thermal anneal can be conducted at a temperature in a range from about 200° C. to about 1100° C. An oxygen source, such as steam, can be provided to assist the conversion of the SiONH network into SiO network. However, if thermal anneal with steam is applied right after $O_3$ cure, a layer of dense dielectric layer containing mostly of SiO network would form on the surface due to its close proximity to the oxygen source. In some embodiments, the thickness of such a dense surface layer is in a range from about 500 Å to about 1200 Å. Such a dense dielectric layer on the surface of flowable dielectric layer 115 would block oxygen source, such as steam, from penetrating or diffusing through the dense top layer to reach the less-converted SiONH network underneath. As a result, the conversion of the SiONH network into SiO network could not occur or occurs very slowly for manufacturing purpose.

Figure 5:
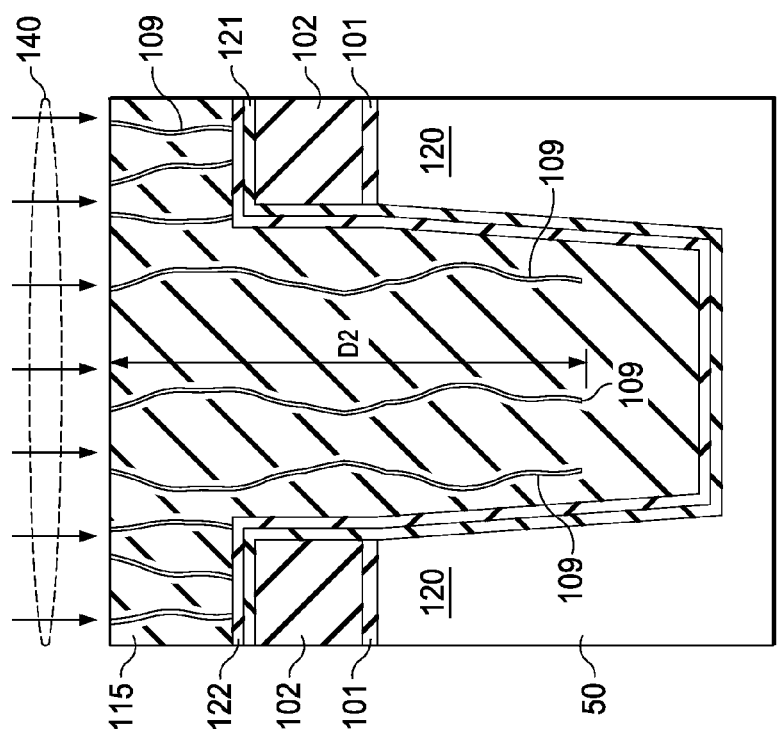

In order to solve this problem, an implant process 140 is conducted to create passages for the oxygen-source to reach the SiONH network below the surface, as shown in FIG. 5 in accordance with some embodiments. The implanted element(s) may include H, He, Si, O, or N. Portions of substrate 50 are not covered by hard layer 102 and are not STI structures. During the implant process 140, these portions of substrate 50 are exposed to the implant sources. H and He atoms are smaller and would not cause damage on such portions of un-covered silicon substrate 50. In contrast, Si, O, and N atoms are heavier and could cause damages of the exposed silicon substrate 50. If one of them is chosen as an implant source, a protective mask, such as a photoresist layer, could be needed.

Table I compares the implant species, implant energy used and implanted depths reached for a cured flowable dielectric layer (similar to layer 115 described above), in accordance with some embodiments. The data in Table I show that heavier elements require higher implant energy to reach the same depths. For example, to reach an implant depth of 2500 Å, H atoms would require an implant energy of about 20 keV, He would require an implant energy of about 25 keV, and N atom would require an implant energy of about 100 keV. In some embodiments, H or He is used as an implant element and the implant energy is in a range from about 6 keV to about 25 keV. The implant depth D2 is in a range from about 1000 Å to about 2500 Å, in some embodiments. The implant concentration is in a range from about 1E13 atoms/$cm^3$ to about 5E15 atoms/$cm^3$ in some embodiments. In some embodiments, a ratio R of implant depth $D_2$ to the depth $D_1$ of the trench is at least ⅓. In some embodiments, the ratio R is in a range from about ⅓ to about ⅔. In some embodiments, the ratio R is in a range from about ⅓ to about ½.

TABLE I

| implant species, depth and energy for flowable dielectric film. | | | |
|---|---|---|---|
| Implant element | Depth 1000 Å | Depth 1500 Å | Depth 2500 Å |
| H | 6 keV | 10 keV | 20 keV |
| He | 10 keV | 15 keV | 25 keV |
| N | 35 keV | 55 keV | 100 keV |

The implant process creates minute passages (or channels) 109 in the surface portion of cured flowable dielectric layer 115, as shown in FIG. 5 in accordance with some embodiments. The passages 109 allow the oxygen-source of the subsequent thermal anneal to reach the SIONH near the bottom of trench 100. The passages 109 also allow the by-products of thermal anneal(s) to escape from the flowable dielectric layer 115 to reach the ambient.

Figure 6:
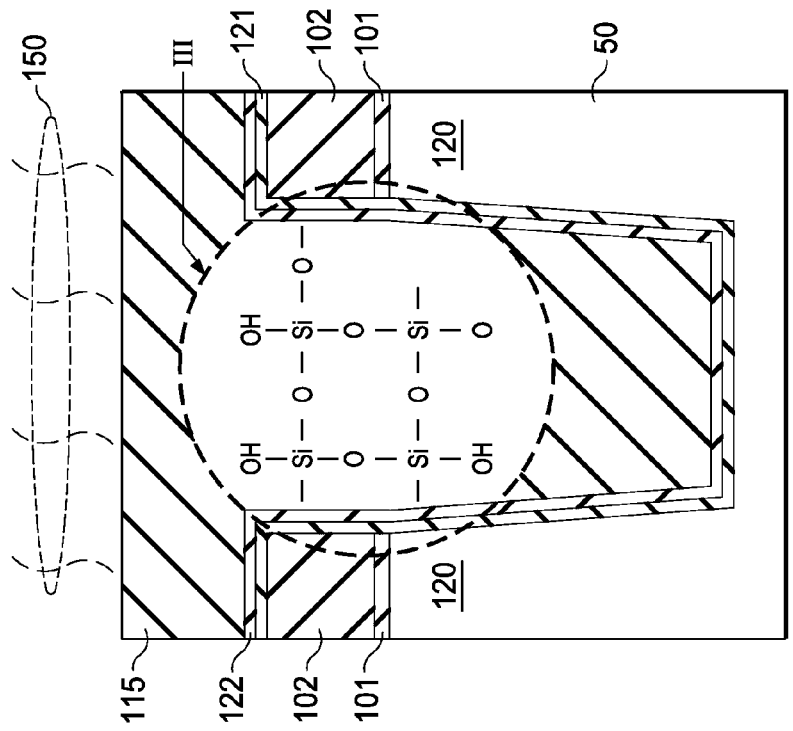

After the implant process 140 described above is performed, the substrate undergoes a steam thermal anneal process 150, as shown in FIG. 6 in accordance with some embodiments. The steam ($H_2O$) penetrates through the passages 109 created by the implant to reach SIONH network and to convert the SiONH network to SiOH and SiO network. The by-products of the conversion, such as $NH_3$, $N_2$, $N_2O$, etc, also can reach the surface of the flowable dielectric layer 115 via passages 109, as shown in FIG. 6.

The steam thermal anneal 150 is conducted in a furnace, in some embodiments. The anneal process 150 is at a temperature in a range of about 150° C. to about 800° C., in some embodiments. The anneal process 150 starts at about 150° C. and ramps up the temperature gradually to a predetermined temperature of about 500° C. to about 800° C. The pressure of the anneal process 150 is in a range from about 500 Torr to about 800 Torr. The flow rate of steam is in a range from about 1 slm to about 20 slm. The duration of the steam thermal anneal process 150 is a range from about 20 minutes to about 2 hrs. The steam anneal process 150 converts the SiONH network in the flowable dielectric layer to a network of SiOH and SiO. FIG. 6 shows an exemplary SiOH and SiO network (III) in flowable dielectric layer 115 at the end of steam thermal anneal process 150.

The steam thermal anneal process 150 causes flowable dielectric layer 115 to shrink. The duration and temperature of the steam thermal anneal process 150 affect the amount of shrinkage.

Figure 7:
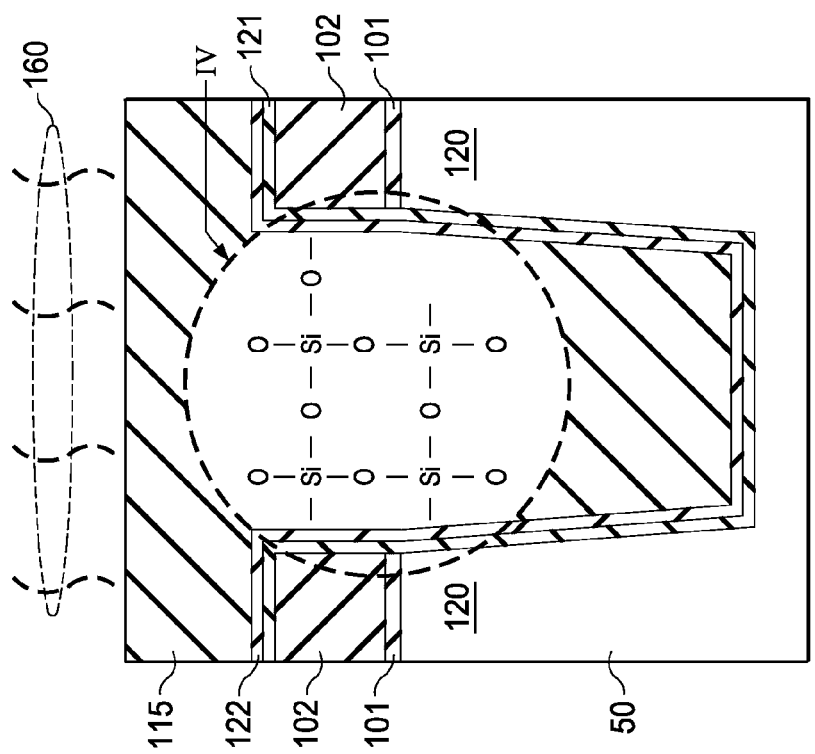

After the steam thermal anneal process described above, a "dry" (without steam) thermal anneal process 160 is conducted to convert the SiOH and SiO network into SiO (or SiO2) network, as shown in FIG. 7 in accordance with some embodiments. During the dry thermal anneal process 160, steam is not used. In some embodiments, an inert gas, such as $N_2$, is used during the dry thermal anneal process 160. In some embodiments, the peak anneal temperature of the dry anneal is in a range from about 1000° C. to about 1200° C. The thermal anneal is conducted in a furnace, in some embodiments. The pressure of the thermal anneal is in a range from about 500 Torr to about 800 Torr. The gas or gases used for the dry thermal anneal process may include an inert gas, such as $N_2$, Ar, He or a combination thereof. The duration of the dry thermal anneal process is a range from about 30 minutes to about 3 hrs. The dry anneal process 160 converts the network of SiOH and SiO in the flowable dielectric layer to a network of SiO (or $SiO_2$). As mentioned above, passages 109 also allow anneal by-products to escape. FIG. 7 shows an exemplary SiO network (IV) in flowable dielectric layer 115 at the end of dry anneal process 160.

The dry thermal anneal process 160 may also cause flowable dielectric layer 115 to shrink further. The duration and temperature of the dry thermal anneal process 160 affect the amount of shrinkage.

The steam and dry anneals also convert the silicon liner layer 122 around the cured flowable dielectric layer 115 into a silicon oxide layer so that no voids or low density regions form in the bottom portion of the STI structure as result of the conversion and densification of the cured flowable dielectric layer 115.

The steam anneal process 150 and dry thermal anneal process 160 cause flowable dielectric layer 115 to shrink. In some embodiments, the volume of the flowable dielectric layer 115 shrinks in a range from about 5% to about 20%. The duration of the anneal processes (150 and 160) affect the amount of shrinking.

Figure 8:
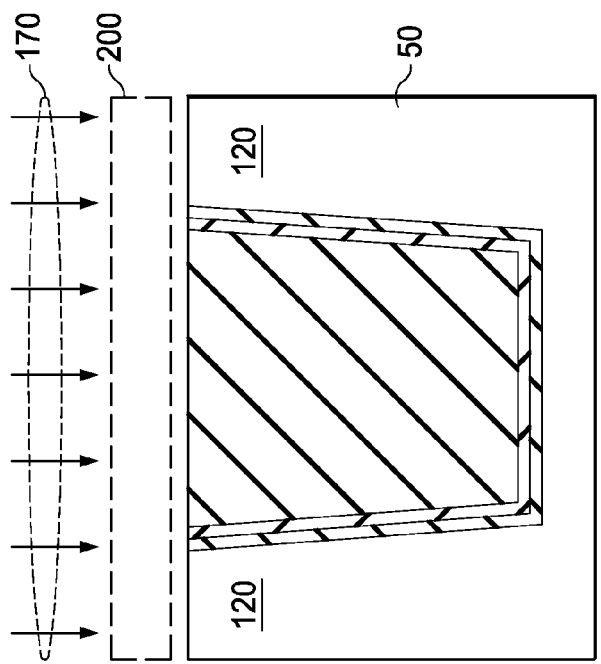

After the dry thermal anneal process, the flowable dielectric layer 115 is fully converted to $SiO_2$, a planarization process 170 is performed to remove flowable dielectric layer 115 outside trench (100), as shown in FIG. 8 in accordance with some embodiments. In some embodiments, the planarization process 170 is a chemical-mechanical polishing (CMP) process. The planarization process 170 removes the flowable dielectric layer 115 outside trench 100, in some embodiments. In some embodiments, the planarization process 170 also removes the hard mask layer 102 and the protective layer 101. In some other embodiments, the planarization process 170 removes the hard mask layer 102; however, the protective layer 101 is removed by an etching process.

After the excess flowable dielectric layer 115 outside the trench (100), the hard mask layer 102, and the protective layer 101 are removed, the STI structure 200 is formed. The passages 109 formed during the implant process 140 disappear by the end of the dry thermal anneal process 160.

Due to the utilization of an implant process 140 to create passages 109 in the cured flowable dielectric layer 115, the total duration of the steam anneal process 150 and the dry anneal process 160 is greatly reduced, in comparison to the 30 plus hours of annealing for manufacturing process described above without the implant process. In some embodiments, the total anneal duration (steam anneal process 150+dry anneal process 160) is in a range from about 6 hrs. to about 15 hrs. The total duration includes the ramp-up and ramp-down time for furnaces. Without the utilization of the implant process 140 to create passages 109 for steam to reach flowable dielectric layer 115 near the bottom of trench 100, additional anneal processes might need to be applied after the planarization process 170 because the anneal processes 150 and 160 form a dense dielectric layer near the surface. The planarization process 170 would remove the dense dielectric layer and the additional anneal processes are needed to convert the exposed flowable dielectric layer 115 to a complete SiO (or $SiO_2$) network. The implant process 140 eliminates the need for additional anneal processes after the planarization process 170. The reduced anneal duration by the above-described process decreases the thermal budget used by the STI process, which enable the manufacturing process for STI to extend to future and more advanced technology generation. In more advanced technology, the thermal budget for forming could be further reduced compared to the current manufacturing technology.

While the above embodiments have been described with reference to using implant to create passages for the oxygen-source to reach the SIONH network below the surface, other mechanisms for creating passages may also be used. For example, plasma treatment or laser beams may also be used to create similar passages.

Embodiments of a mechanism for forming a shallow trench isolation (STI) structure filled with a flowable dielectric layer are provided. The mechanism involves performing an implant to generate passages in the upper portion of the flowable dielectric layer. The passages enable oxygen source in a thermal anneal to reach the flowable dielectric layer near the bottom of the STI structure during the thermal anneal to convert a SIONH network of the reflowable dielectric layer to a network of SiOH and SiO. The passages also help to provide escape paths for by-products produced during another thermal anneal to convert the network of SiOH and SiO to $SiO_2$.

In some embodiments, a method of forming a semiconductor structure is provided. The method includes depositing a flowable dielectric layer in a trench of a substrate, and performing an implant process on the flowable dielectric layer. The method also includes performing a first thermal anneal with an oxygen source, and performing a second thermal anneal. The method further includes performing a planarization process to remove excess flowable dielectric layer outside the trench.

In some other embodiments, a method of forming a shallow trench isolation (STI) structure in a substrate is provided. The method includes depositing a flowable dielectric layer in a trench of the substrate by a chemical vapor deposition (CVD) process, and the flowable dielectric layer fills the trench without forming a void. The method also includes curing the deposited flowable dielectric layer with $O_3$, and performing an implant process on the flowable dielectric layer. The implant process generates passages in top portion of the flowable dielectric layer. The method further includes performing a steam thermal anneal with an oxygen source, and performing a dry thermal anneal. In addition, the method includes performing a planarization process to remove excess flowable dielectric layer outside the trench.

In yet some other embodiments, a method of forming a shallow trench isolation (STI) structure in a substrate is provided. The method includes depositing a flowable dielectric layer in a trench of the substrate, and the trench has an aspect ratio greater than about 8. The flowable dielectric layer fills the trench without forming a void. The method also includes performing an implant process on the flowable dielectric layer, and performing a first thermal anneal with an oxygen source. The method further includes performing a second thermal anneal, and performing a planarization process to remove excess flowable dielectric layer outside the trench.

While the above embodiments have been described with reference to shallow trench isolation, one skilled in the art will appreciate that the present disclosure could apply to various other structures in which it is desirable to fill a trench or gap, particularly a trench or gap having a high aspect ratio, with a good quality dielectric.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor structure comprising:
   depositing a flowable dielectric layer in a trench of a substrate;
   curing the flowable dielectric layer after the step of depositing;
   performing an implant process on the flowable dielectric layer after the step of curing;
   performing a first thermal anneal with an oxygen source after the implant process;
   performing a second thermal anneal after the implant process; and
   subsequently, performing a planarization process to remove excess flowable dielectric layer outside the trench.

2. The method of claim 1, wherein the implant process implants either H or He atoms.

3. The method of claim 1, wherein an implant depth of the implant process is in a range from about 1000 Å to about 2500 Å.

4. The method of claim 1, wherein an implant energy is in a range from about 6 keV to about 25 keV.

5. The method of claim 1, wherein a ratio of an implant depth to a depth of the trench is in a range from about ⅓ to about ½.

6. The method of claim 1, wherein the implant process creates passages for the oxygen source of the first thermal anneal to reach the flowable dielectric layer near bottom of the trench.

7. The method of claim 1, wherein a peak anneal temperature of the first thermal anneal is in a range from about 500° C. to about 800° C. and the oxygen source is steam.

8. The method of claim 1, wherein a peak anneal temperature of the second thermal anneal is in a range from about 1000° C. to about 1200° C.

9. The method of claim 1, wherein a total anneal time of the first thermal anneal and the second thermal anneal is in a range from about 6 hrs. to about 15 hrs.

10. The method of claim 1, wherein a source gas used to deposit the flowable dielectric layer is trisylamine (TSA).

11. The method of claim 1, wherein the flowable dielectric layer is deposited by a radical-component chemical vapor deposition (CVD) process.

12. The method of claim 1, wherein the as-deposited flowable dielectric layer includes a network of SiONH.

13. The method of claim 1, wherein the first thermal anneal and the second thermal anneal convert the deposited flowable dielectric layer into silicon dioxide ($SiO_2$).

14. The method of claim 1, wherein the step of curing is performed using ozone ($O_3$).

15. A method of forming a shallow trench isolation (STI) structure in a substrate; comprising:
   depositing a flowable dielectric layer in a trench of the substrate by a chemical vapor deposition (CVD) process, wherein the flowable dielectric layer fills the trench without forming a void;
   curing the deposited flowable dielectric layer with $O_3$;
   performing an implant process on the flowable dielectric layer, wherein the implant process generates passages in a top portion of the flowable dielectric layer;
   performing a steam thermal anneal with an oxygen source;
   performing a dry thermal anneal; and
   performing a planarization process to remove excess flowable dielectric layer outside the trench.

16. The method of claim 15, wherein a source gas used to deposit the flowable dielectric layer is trisylamine (TSA) and the flowable dielectric layer is deposited by a radical-component chemical vapor deposition (CVD) process.

17. The method of claim 15, wherein the steam thermal anneal and the dry thermal anneal convert a SiONH network in the deposited flowable dielectric layer into silicon dioxide ($SiO_2$).

18. The method of claim 15, wherein the implant process implants either H or He atoms.

19. A method of forming a shallow trench isolation (STI) structure in a substrate; comprising:
   depositing a flowable dielectric layer in a trench of the substrate, wherein the flowable dielectric layer fills the trench without forming a void;
   after the depositing the flowable dielectric layer, curing the flowable dielectric layer using $O_3$;
   after the curing, performing an implant process on the flowable dielectric layer;
   after the implant process, performing a first thermal anneal with an oxygen source;
   performing a second thermal anneal; and
   performing a planarization process to remove excess flowable dielectric layer outside the trench.

20. The method of claim 19, wherein the implant process creates passages in the flowable dielectric layer.

* * * * *